United States Patent
Moulard

(10) Patent No.: US 8,436,745 B2
(45) Date of Patent: May 7, 2013

(54) FLOW CONSUMPTION MODULAR METER

(75) Inventor: Jean-Michel Moulard, Saint Nom la Breteche (FR)

(73) Assignee: Electricite de France, Paris (FR)

( * ) Notice: Subject to any disclaimer, the term of this patent is extended or adjusted under 35 U.S.C. 154(b) by 319 days.

(21) Appl. No.: 12/747,580

(22) PCT Filed: Dec. 11, 2008

(86) PCT No.: PCT/FR2008/052284
§ 371 (c)(1),
(2), (4) Date: Jun. 11, 2010

(87) PCT Pub. No.: WO2009/081001
PCT Pub. Date: Jul. 2, 2009

(65) Prior Publication Data
US 2010/0271234 A1   Oct. 28, 2010

(30) Foreign Application Priority Data

Dec. 12, 2007  (FR) ..................................... 07 08661

(51) Int. Cl.
*G08B 23/00*  (2006.01)
*G08C 15/06*  (2006.01)

(52) U.S. Cl.
USPC ................................ 340/870.02; 340/870.01

(58) Field of Classification Search ............ 340/870.02, 340/870.01; 341/122; 702/61
See application file for complete search history.

(56) References Cited

U.S. PATENT DOCUMENTS

| 4,571,691 A | 2/1986 | Kennon |
| 5,870,911 A | 2/1999 | DeWalch |
| 6,069,571 A * | 5/2000 | Tell .......................... 340/870.02 |
| 6,483,289 B2 * | 11/2002 | Reid .............................. 324/115 |
| 6,611,772 B1 * | 8/2003 | Lavoie et al. .................... 702/61 |
| 2004/0070517 A1 | 4/2004 | Ehrke et al. |
| 2005/0194962 A1 | 9/2005 | Briese et al. |
| 2008/0238713 A1 * | 10/2008 | Banhegyesi et al. ..... 340/870.02 |

FOREIGN PATENT DOCUMENTS

| EP | 0 598 521 A2 | 5/1994 |
| EP | 0 715 171 A2 | 6/1996 |
| WO | WO 94/19899 A1 | 9/1994 |

* cited by examiner

*Primary Examiner* — Peguy Jean Pierre
(74) *Attorney, Agent, or Firm* — Drinker Biddle & Reath LLP

(57) ABSTRACT

The invention relates to a flow consumption modular meter. It comprises a base module providing the connection between flow distribution lines and a subscriber supply, equipped with a metering connection interface and a metering module equipped with an interface for connecting to the base module via the metering connection interface. Electrical components of a permanent nature are installed in the base module and electronic components of a changeable nature are installed in the metering module. Application to flow meters, particularly electricity meters.

14 Claims, 8 Drawing Sheets

VOLTAGE PART | CURRENT PART | CONTROL PART | ANTI-FRAUD PART

FLOW CONSUMPTION MODULAR METER

CROSS-REFERENCE TO RELATED APPLICATIONS

This application is the U.S. national phase of the International Patent Application No. PCT/FR2008/052284 filed Dec. 11, 2008, which claims the benefit of French Application No. 07 08661 filed Dec. 12, 2007, the entire content of which is incorporated herein by reference.

FIELD OF THE INVENTION

The invention relates to flow consumption meters, the notion of flow encompassing domestic and/or industrial flows.

The aforementioned flows include, notably, water, gas and electricity as far as domestic flows are concerned, to which fuels and industrial gases must be added for the industrial flows.

BACKGROUND

At the present time, the modernization and improvement of the reliability of metering systems are a major focus of research and development in all industrialized countries.

In particular, an essential objective of the corresponding work relates to the implementation of new services directly linked to metering and, by extension, to energy savings.

Moreover, the main objective of the aforementioned new services is to reduce the work required on subscribing customers' premises, thanks to the implementation of centralized management and operation of each flow meter.

In France, for example, the distribution of a flow such as electricity alone involves some 34 million metering points.

Moreover, a related objective of a centralized management and operation of this type is the rationalization and generalization of antifraud tools, themselves controlled in a centralized manner, in order to reduce to a strict minimum the physical work required on each metering point, whereby the number of types of physical work can thus be reduced to a single type, the pure and simple changing of the metering elements alone.

The most complex flow meters, those notably implemented for metering the distribution of electricity, are electronic meters comprising all or some of the following units:

voltage sensor, current sensor, cut-off unit, metrological pre-processing circuits, processing, supply, display, telecommunications interface, keypad or push buttons, external sensor interface.

In particular, the communications interfaces are connected to the public switched telephone network, PSTN, the optical fiber network, the radio network, the powerline communications network (PLC) or other network, according to the availability of these networks.

In the domain of electricity metering, two families of meters exist: industrial meters, in which the physical variables of voltage and current are measured with the aid of sensors external to the meters, and domestic meters where the corresponding sensors are located inside the meter, the electrical current consumed by the subscribing customer passing in totality through the meter.

In the case of domestic meters, with a subscribed three-phase power in France below 36 kVA, the constraints of heating are consequently greater. In fact, the input of the cable via the electrical distribution network, upstream of the meter, and the output of the cable to the custom installation, downstream of the meter, are directly connected to the circuits of the meter.

Screw terminal blocks guarantee mechanical stability and electrical continuity.

A derived version of the domestic meter has more recently appeared, in the form of a plug-in meter.

This type of meter comprises two parts: a base integrating all of the connections to the power cables and the communications links, and a meter part equipped with specific power and communications interfaces to be connected to the base by means of a power plug. The aforementioned part has all the other units of the meter, i.e. the sensors, the energy calculation component, the display, etc. A meter of this type is shown in FIG. 1a.

The plug-in meter allows the meter part to be changed without work being carried out on the network cables and the customer cables.

However, all of the electricity measured by the meter part passes through the latter, as in the case of the conventional electronic meter.

The functions performed by the meter part of the plug-in meter are shown in FIG. 1b.

Although plug-in meters enable a standardization of the distribution points of the electrical flow thanks to the implementation of a single type of base, enabling significant gains in terms of maintenance and logistics and avoiding the frequent handling of the cables while minimizing the risks of heating, the base being installed once and for all, the plug-in part is, however, the source of real disadvantages.

A first disadvantage is to be found in the dimensioning of the terminals of the plug-in part, which must be capable of forwarding the maximum power subscribed by the subscribing customer. The routing of electrical current intensities which can reach 90 A imposes the implementation of a contact system in the base allowing the plugs of the meter to be gripped sufficiently. The tighter this grip, the greater the mechanical action, i.e. wear through friction, of the manual insertion or removal of the plugs. This constraint imposes a ruggedized mechanical design, notably in the case of the three-phase meter in which the number of power inputs and outputs is doubled. The aforementioned mechanical specifications for the plugs are costly and prohibit the installation of this type of meter on the boards of existing meters which are not adapted for this purpose.

A second disadvantage is safety-related. The ECEBI plug-in meter used in France must be fitted with a device to detect and inhibit an unplugging of the meter part by an unauthorized third party, as the risks of electrocution are significant. This function is currently performed by a simple sealed screw.

In France, experience has shown that the main cause of failure of conventional electronic meters and plug-in meters is the malfunction of the electronic components. In 80% of cases, the components, notably those of the supply, the display and protection components are involved.

Finally the patent application US 2004/070 517 describes an electronic meter for electricity in which a subdivision of the circuits between the power circuits and the circuits likely to be changed is proposed. However, all of the latter are integrated into a single housing.

SUMMARY

The object of the present invention is to overcome the aforementioned disadvantages, described for conventional and plug-in electronic meters for electricity, or more generally for flow.

Another object of the present invention is the implementation of a new type of meter: a modular meter, authorizing the implementation of a wide variety of metering-related services, notably, in a non-limiting manner, remote control of:
- the remote reading of the metering indices, via a communications network;
- the programming of new tariffs in the meter;
- the modification of the meter parameters;
- the interruption of the power supply;
- the gathering of information;
- the management of the security of the transactions between each meter and a centralized management and operation point;
- the management of antifraud security measures.

The modular meter for the consumption of flow by a subscribing customer which is the subject of the invention is noteworthy in that it includes at least a base module allowing the connection configuration of the flow delivery point to be adapted, to provide the connection of the flow distribution lines and the supply lines of the subscriber installation, this base module being equipped with a metering connection interface. It is furthermore noteworthy in that it includes a metering module equipped with an interface for connecting to this base module, via this metering connection interface, and in that all of the electrical components performing the non-intelligent functions of a permanent nature are installed in this base module, and in that all of the electronic components performing intelligent functions of a changeable nature are installed in this metering module.

The modular meter which is the subject of the invention, applied to the metering of electricity, is also noteworthy in that it furthermore comprises a module for matching the functions of the base module and the metering module, this matching module enabling the performance, during the connection of the metering module to the base module, of at least a function of calibration of the values of the current and voltage delivered by the base module respectively subscribed, requested and measured by the metering module, according to the installation parameters of the subscribing customer.

The aforementioned modular meter which is the subject of the invention is furthermore noteworthy in that the matching module includes an auto-calibration program for the components of the base module, directly executable by a microcontroller.

According to a different noteworthy aspect of the modular meter which is the subject of the invention, the execution of the auto-calibration program is conditional on a successful authentication of the metering module vis-à-vis the base module or vice versa.

According to a different particularly noteworthy aspect of the modular meter which is the subject of the invention the metering module installed by plugging it into the base module furthermore comprises a sealed fixing screw to fix the metering module to the base module, and resources to detect an access to the sealed fixing screw, allowing the cut-off units to be controlled in the base module.

This modular meter which is the subject of the invention can be applied not only to electricity meters, but, more generally, to the most common flow meters.

BRIEF DESCRIPTION OF THE DRAWINGS

It will be more clearly understood from a reading of the description and a study of the drawings below in which, in addition to FIGS. 1a and 1b which relate to the prior art:

FIG. 4b shows the assignment of the connection terminals of the diagram of connection terminals shown in FIG. 4a;

DETAILED DESCRIPTION

Figure 2A:
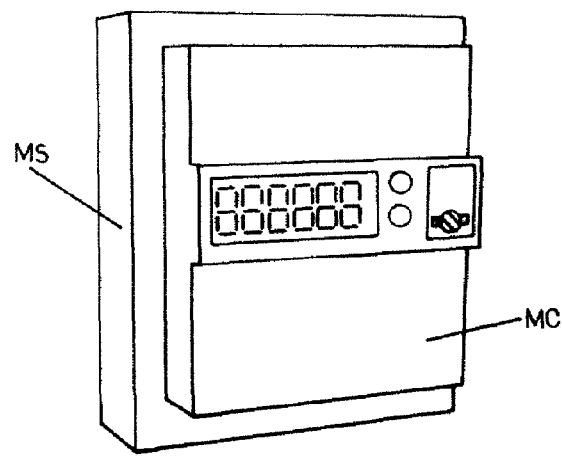
FIG. 2a shows, by way of illustration, a modular meter according to the subject of the present invention.

A more detailed description of the modular meter of flow consumption by a subscribing customer, according to the subject of the present invention, will now be provided with reference to FIG. 2a et seq.

With reference to the aforementioned FIG. 2a, it is indicated that the modular meter which is the subject of the invention comprises at least a base module, denoted MS, allowing the connection configuration of the flow delivery point to be adapted in order to provide the connection of the flow distribution network lines and the supply lines of the subscriber installation.

Figure 2B:
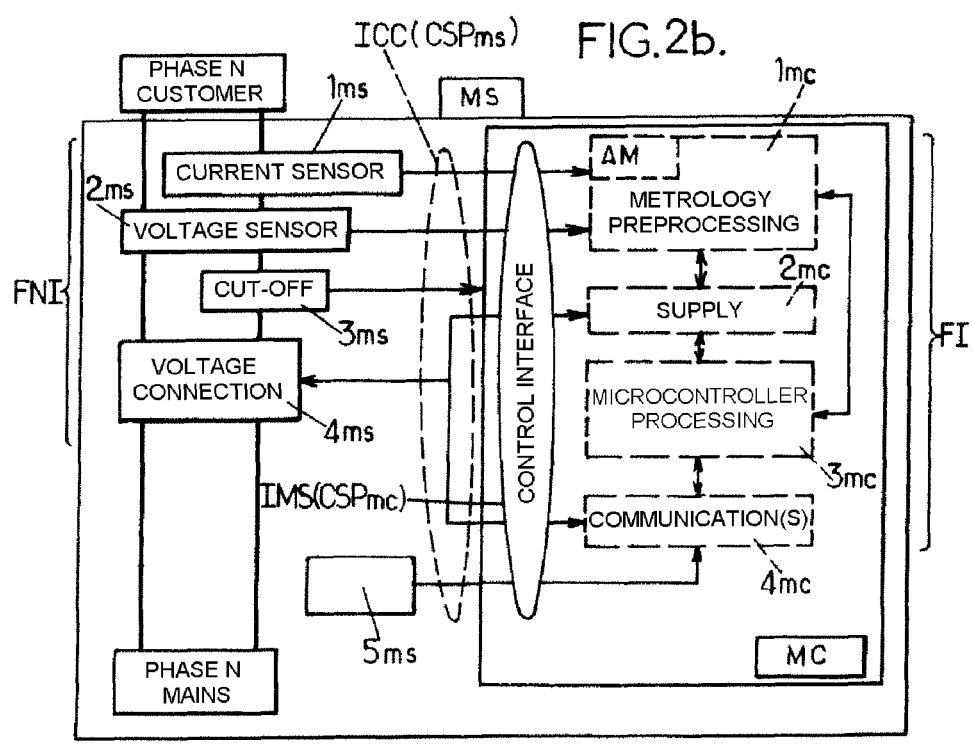
FIGS. 2b and 2c show, by way of illustration, the distribution of functionalities between the base module and the metering module, according to a first and according to a second variant respectively.

Furthermore, as shown in FIG. 2b, the base module MS is fitted with a metering connection interface, denoted ICC.

Moreover, the modular meter which is the subject of the invention includes a metering module, denoted MC, fitted with an interface for connecting to the base module, MS, the aforementioned connection interface being denoted IMS in FIG. 2b.

It is understood, in particular, that the connection of the metering module MC to the base module MS is established via the aforementioned metering connection interface ICC fitted to the base module MS.

According to a different particularly advantageous characteristic of the flow consumption modular meter which is the subject of the invention, all of the electrical components performing non-intelligent functions denoted FNI of a permanent nature are installed in the base module MS and all of the electronic components performing intelligent functions denoted FI of a changeable nature are installed in the metering module MC. Thus, with reference to FIGS. 2a and 2b, it is understood that the base module MS allows the mechanical configuration of the energy or flow delivery point to be adapted to any new metering module.

The base module MS is indispensable for adapting all conceivable types of metering board. It allows the connection to be made between the supply network lines and the distribution lines of the subscribing customer.

Conversely, the metering module MC can be equipped with intelligent functions FI.

Thus, according to a subject of the invention, the non-intelligent and least-ageing functionalities are integrated into the base module, whereas all of the changeable functionalities are integrated into the aforementioned metering module MC. Knowing that electronic components age quickly, the base module in practice holds none or few. Conversely, the metering module with modular characteristics is easily interchangeable. In fact, it holds all of the passive or active electronic components of the metering system.

In particular, as shown in FIG. 2b, the components performing the functions of a permanent nature and therefore the non-intelligent functions include at least the current sensors denoted 1ms, the voltage sensors denoted 2ms, the cut-off units 3ms, the voltage connection circuits, denoted 4ms, and the communications modules or physical links, denoted 5ms, to the subscribing customer and to the flow-distributing entity, for example. All of the aforementioned components allow the previously mentioned non-intelligent functions FNI to be performed.

Conversely, as shown in FIG. 2b, the components performing the functions of a changeable nature include at least the metrological preprocessing components denoted 1mc, the electronic supply components 2mc, the components for processing by microcontroller or microprocessor denoted 3mc, and the networked communications components denoted 4mc.

Moreover, as shown in FIG. 2b, for flow such as electrical current, the base module MS is adapted to provide the connection to the metering board. The metering connection interface ICC then comprises a specific electrical connector, denoted CSPms, and the interface for connecting to the base module IMS fitted to the metering module MC similarly comprises a different specific connector denoted CSPmc. The metering module MC is connected to the base module MS by simply plugging the connector CSPmc into the specific electrical connector CSPms.

Figure 2C:
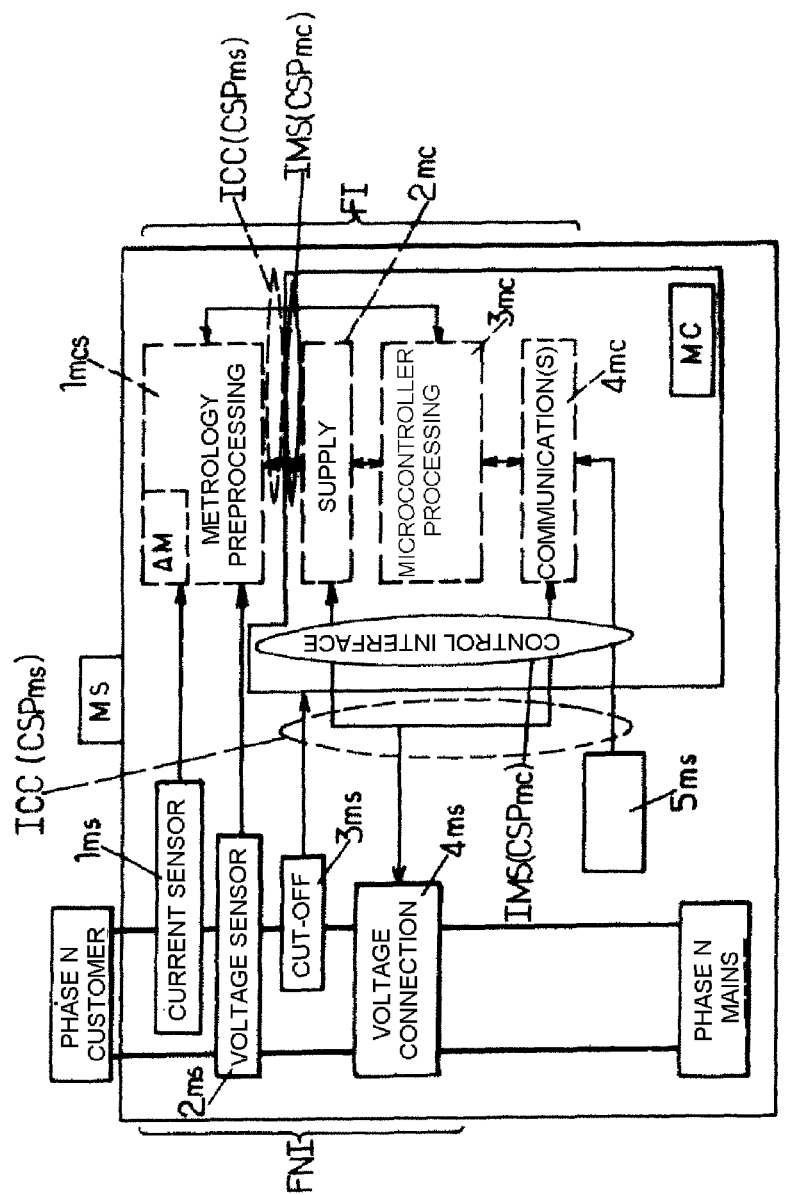

According to a non-limiting implementation variant of the flow consumption modular meter according to the invention, as shown in FIG. 2c, the metrological preprocessing component denoted 1mc as shown in FIG. 2a may conversely be integrated into the base module MS for reasons of convenience of manufacturing and implementation of the flow consumption modular meter which is the subject of the invention.

Figure 3A:
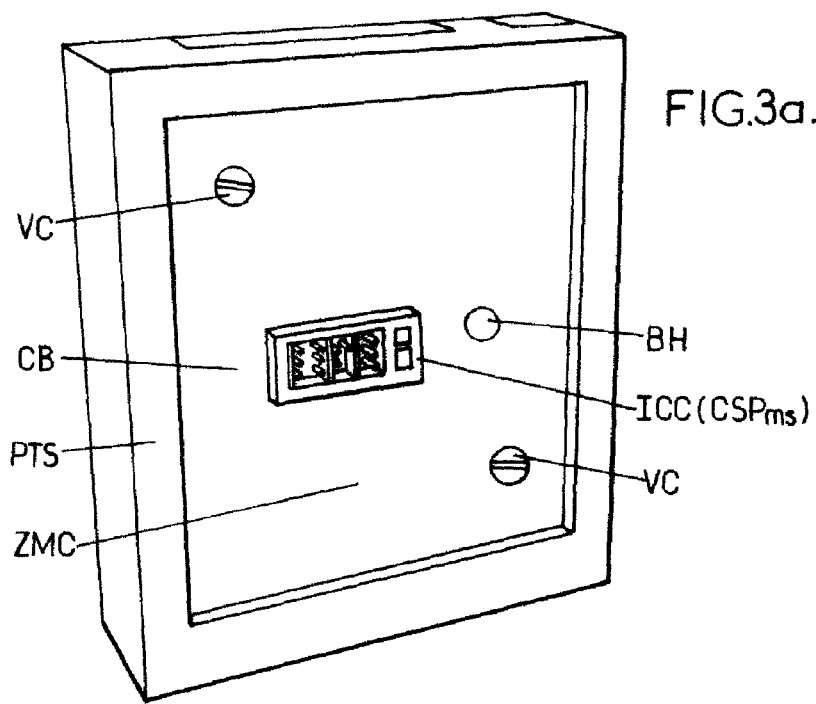
FIG. 3a shows, by way of illustration, a preferred, non-limiting embodiment of the base module for a single-phase and/or three-phase meter.
Figure 3B:
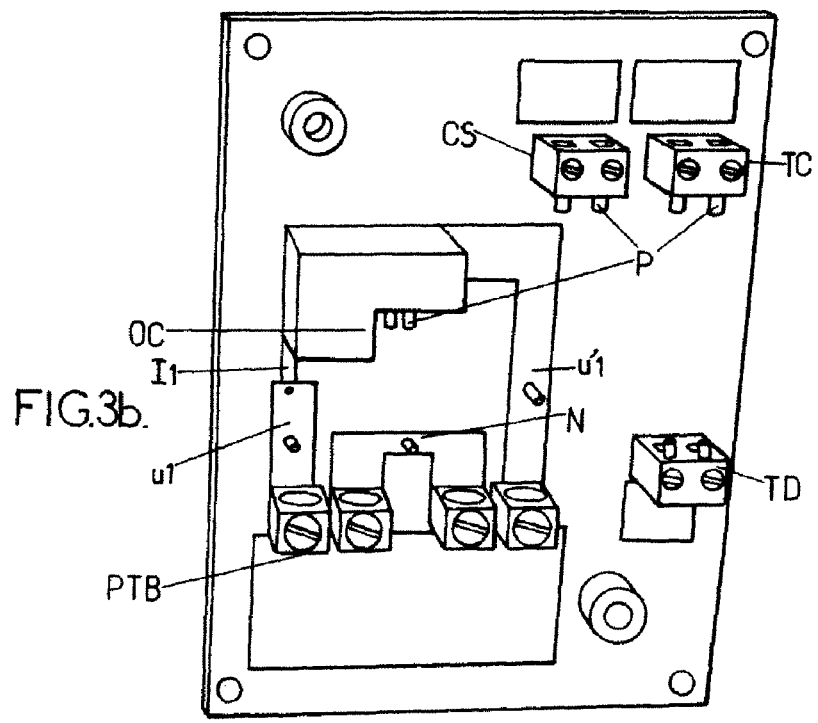
FIG. 3b shows, by way of illustration, an implementation of the components of the base module for a single-phase meter.
Figure 3C:
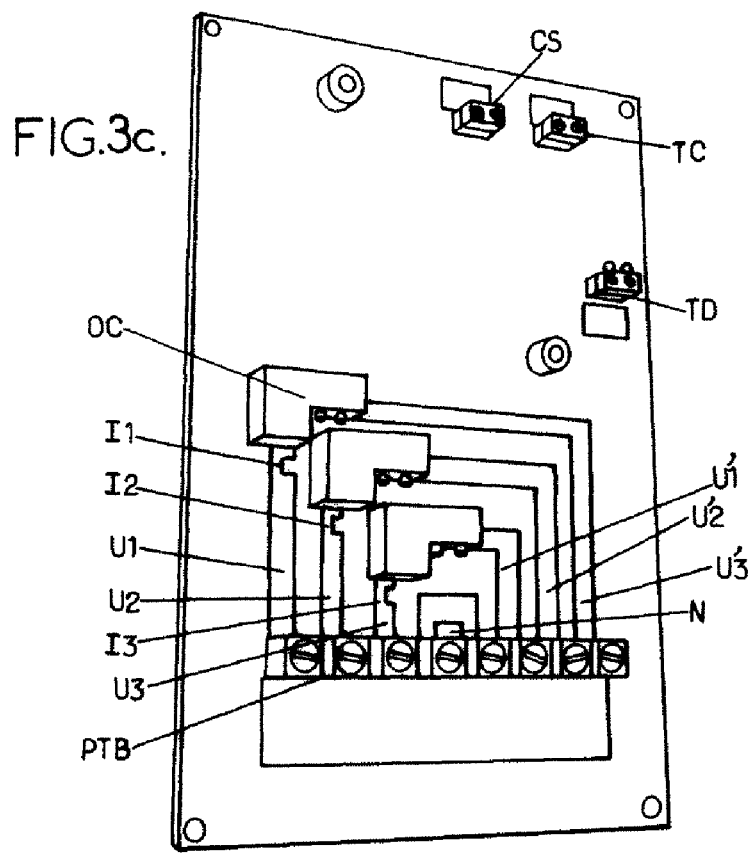
FIG. 3c shows, by way of illustration, an implementation of the components of the base module for a three-phase meter.

A description of the base module MS will now be provided with reference to FIGS. 3a, 3b and 3c.

As shown in FIG. 3a, the base module MS essentially comprises two elements:
   a fixing plate carrying the functionalities and components of the base module, denoted PTS, and
   a terminal faceplate CB more or less covering the fixing plate.

The base module MS shown in FIG. 3a thus comprises, on the terminal faceplate CB, a zone reserved for the metering module denoted ZMC, fixing screws for the terminal faceplate denoted VC, a tapped hole for fixing the metering module denoted BH, and, obviously, the specialized connector CSPms constituting the metering connection interface denoted ICC. It furthermore comprises, in the terminal faceplate BC, a tapped hole for fixing the metering module if the latter has been installed by plugging it into the specialized connector CSPms.

In a general manner, the base module MC, as shown in FIG. 3a, is more or less identical for the metering of electricity delivered by single-phase or three-phase current. In particular, it is understood that the difference caused by the supply of energy as single-phase or three-phase current results in a simple difference of dimensioning of the plate PTS.

It is understood, in particular, that the flow consumption modular meter which is the subject of the invention, if the flow is of electricity, is particularly advantageous as it in fact allows all of the delivery points to be harmonized. Indeed, in France, for example, single-phase current accounts for around 80% of metering and three-phase current accounts for 20% of metering. This diversity of equipment results in a multiplication of the equipment tools and procedures, thereby increasing maintenance costs for the electricity distributor.

Conversely, the flow consumption modular meter which is the subject of the invention comprises a base module for single-phase connections and a base module for three-phase connections which are identical, apart from the difference in dimensions, as previously seen, while the interface between the metering module and the aforementioned base modules is more or less identical, as it uses the same specialized connector.

Thus, the metering module constituting the intelligent part and implementing the intelligent functions FI can be connected to both bases. Thus, the modular meter which is the subject of the invention allows a single type of meter to be managed over an entire territory, regardless of the type of single-phase or three-phase connections.

Details of the operation of the base module MS will now be provided with reference to FIGS. 3b and 3c. In a general manner, it is indicated that the fixing plate denoted PTS comprises:
   the fixing plate itself made of synthetic material;
   connection terminals for the power cables;
   connection terminals for the interfaces such as dry contact (relay), distributor interfaces, customer interfaces;
   voltage and current sensors;
   the cut-off unit;
   a connector allowing the interface to be operated with the metering module as mentioned above.

The terminal faceplate CB covers virtually the entire fixing plate PTS. It is preferably made of synthetic material and fitted with two fixing screws VC establishing the mechanical connection with the plate.

The terminal faceplate CB is fitted with an opening allowing the specific connector CSPms to be visible when the terminal faceplate is in place. A service flap may be disposed above the terminal faceplate CB in order to allow the customer to access the terminals of a dry contact and the customer interface without having to remove the terminal faceplate CB.

A preferred mode of installation of the components performing the functions of the base module MS for a single-phase connection will now be described with reference to FIG. 3b, shown when the terminal faceplate CB is removed.

The pins p shown in the diagram in FIG. 3b, associated with each of the components, indicate the points for electrical connection with the specialized connector CSPms on the front surface of the base module MS, as shown in FIG. 3a. In order not to overload the drawing shown in FIG. 3b, the aforementioned specialized connector is not shown.

With reference to the aforementioned FIG. 3b, the references denote:

I1: current sensor on phase 1, 2 contacts;
U1: potential measuring point on phase 1, upstream, distribution network side, 1 contact;
N: neutral potential measuring point on phase 1, downstream, customer installation side, 1 contact;
U'1: potential measuring point on phase 1, downstream, customer installation side, 1 contact;
OC: cut-off unit, 2 contacts;
CS: dry contact, 2 contacts;
TC: customer communications interface, 2 contacts:
TD: distributor communications interface, 2 contacts.

FIG. 3c shows an analogous installation of the components for three-phase metering.

The same references denote the same elements as in the case of FIG. 3b. I1 to I3 denote the current sensors on phases 1, 2 and 3, U1 to U3 denote the potential measuring points on phases 1, 2 and 3, upstream, U'1 to U'3 denote the potential measuring points on phases 1, 2 and 3, downstream.

Figure 4A:
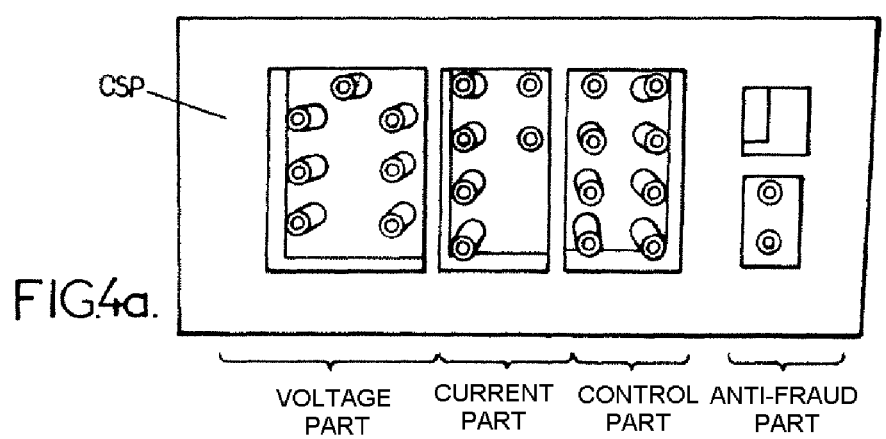
FIG. 4a shows a diagram of the installation of the connection terminals of the metering connection interface for a base module of a single-phase or three-phase modular meter.
Figure 4B:
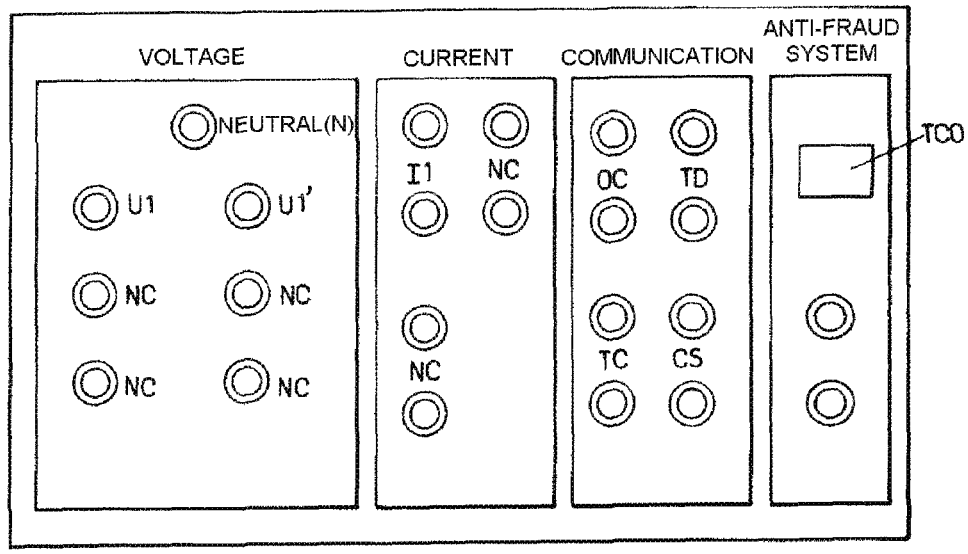

A more detailed description of the specific connector CSPms constituting the metering connection interface ICC fitted to the base module MS will now be provided with reference to FIGS. 4a and 4b.

With reference to FIG. 4a, it is indicated that the aforementioned specific connector CSPms comprises a material structure which is more or less identical for single-phase metering and for 3-phase metering.

In particular, the aforementioned specific meter is divided into a plurality of functional zones as shown in the drawing, i.e. a voltage zone or part, a current zone or part, a control zone or part and an antifraud zone or part.

The aforementioned zones each comprise a certain number of connection terminals for which the assigned function is described below with reference to FIG. 4b, for the specific case of single-phase metering.

In FIG. 4b, the voltage zone or part comprises a neutral terminal, N, 2 upper terminals denoted U1 and U'1, relating to the connection of the aforementioned upstream and downstream voltage connectors. The 4 additional terminals NC are not connected in single-phase metering.

The current zone or part comprises 2 connection terminals denoted I1 corresponding to the measure of current. The other pairs of connection terminals of the aforementioned zone are not connected NC in single-phase metering.

The control or communications zone or part comprises 2 cut-off unit control terminals denoted OC, 2 distributor communications interface terminals denoted TD, 2 customer communications interface terminals denoted TC, and 2 dry contact connection terminals denoted CS.

The antifraud system zone comprises a service flap TCO allowing the passage of a mechanical antifraud control unit, which will be described later in the description. It furthermore comprises 2 antifraud control contact terminals.

For a specific connector CSPms in three-phase metering, it is understood that the non-connected terminals, denoted NC, are assigned to the functions of the other phases 2 and 3.

Figure 4C:
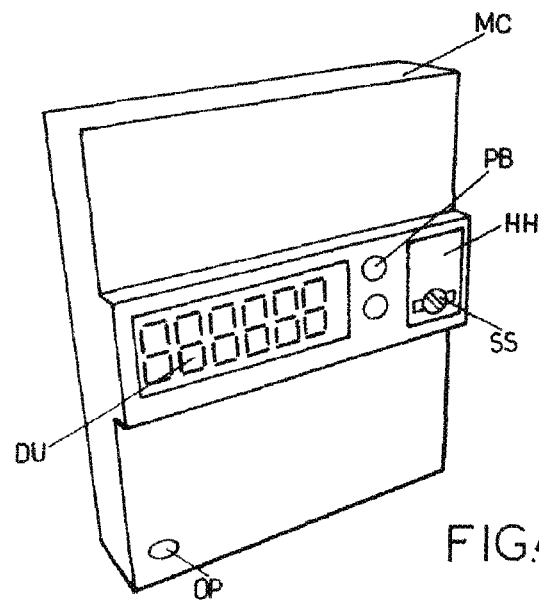
FIG. 4c shows, by way of illustration, the general aspect of a metering module, for a single-phase or three-phase modular meter.

Finally, the metering module MC is shown in FIG. 4c. On the rear surface (not shown), this module has the connector CSPmc allowing the connection to be made to the specific connector CSPms fitted to the base module MS, for single-phase or three-phase metering.

On the front surface, as shown in FIG. 4c, the metering module is advantageously fitted with a service flap providing access to the screw which fixes the metering module MC to the base module MS. The aforementioned service flap is denoted HH in FIG. 4c. The aforementioned service flap is closed by a screw SS adapted to the application of a seal of a conventional type.

On its front surface, the metering module is fitted with a liquid crystal display denoted DU. Pushbuttons are also provided on the front surface, denoted BP, which allow a user to select the data to be displayed by the display DU.

Moreover, on the front surface, an optical interface or optical communications port denoted OP allows the metering module to be configured locally by means of an optical communications interface.

When the metering module MC has been installed, it automatically detects whether it is connected to a single-phase or three-phase metering base by measuring the presence of voltage between the neutral connection and the different phases. The operation of the metering module is then selected according to the presence of single-phase or three-phase voltage respectively.

In one particularly advantageous embodiment, the flow consumption modular meter which is the subject of the present invention also comprises a module for matching the functions of the base module MS and the metering module MC.

On connection of the metering module MC to the base module MS, the matching module enables the performance of at least one function to calibrate the values of the current and voltage delivered by the base module and respectively subscribed, requested and measured by the metering module MC according to the installation parameters of the subscribing customer.

Figure 1A:
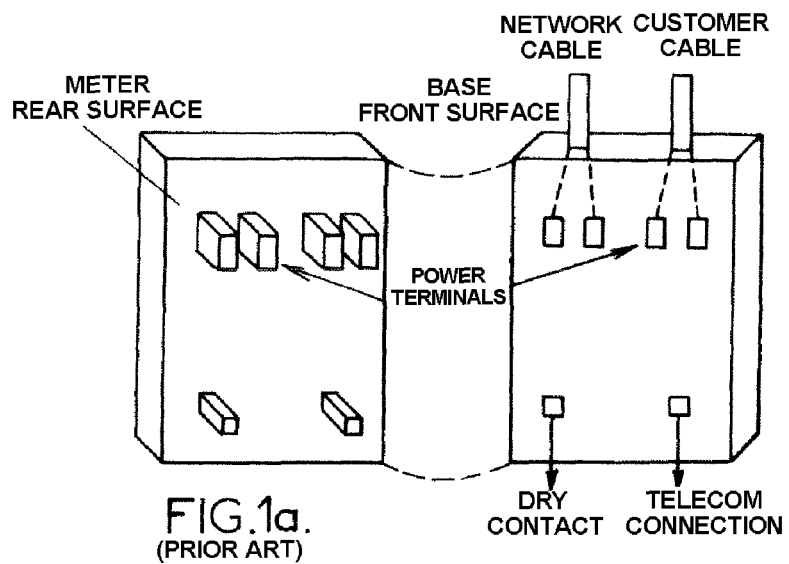
Figure 1B:
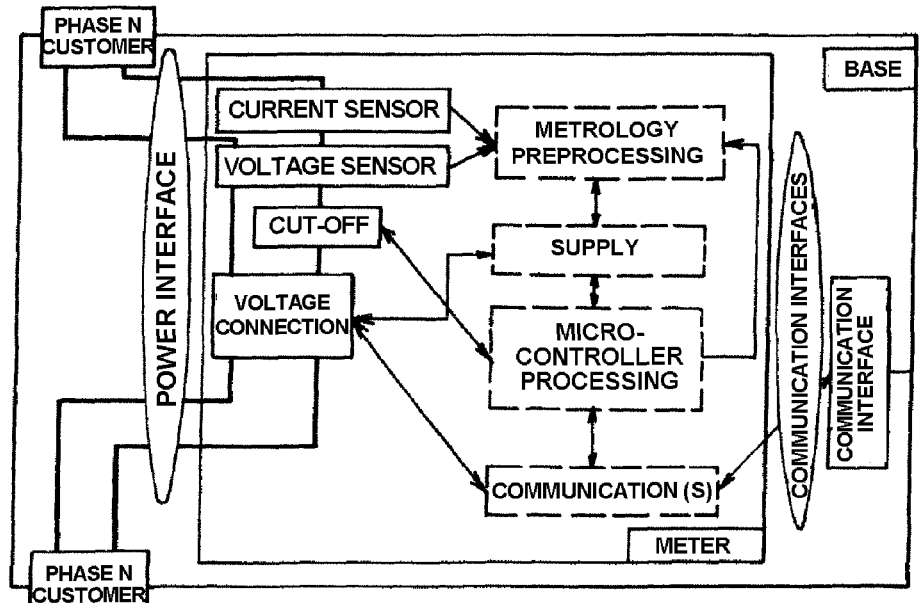

It is understood, in particular, in a preferred, non-limiting embodiment, that the aforementioned matching module is preferably installed in the metrological preprocessing module denoted 1mc in FIG. 2b and 1mcs in FIG. 2c respectively.

In a preferred, non-limiting embodiment, the matching module AM enables, in a particularly advantageous manner, the performance of a function to authenticate the metering module MC on the basis of authentication parameters relating to the flow distributor, the subscribing customer's installation, the validity of the operation of the installation and/or the changing or replacement of the metering module MC.

For this purpose, the matching module AM advantageously includes at least one precise gauge of the sensors and components included in the base module MS.

Finally, the matching module advantageously includes a memory enabling the storage of a plurality of parameters such as the parameters for correction of all of the components included in the base module MS, for authentication of the subscribing customer's installation and/or the flow-distributing entity.

In a preferred, non-limiting, embodiment, the matching module furthermore includes a program for auto-calibration of the components of the base module MS, this program being directly executable by the microcontroller or by a microprocessor as previously described in the description.

Figure 5:
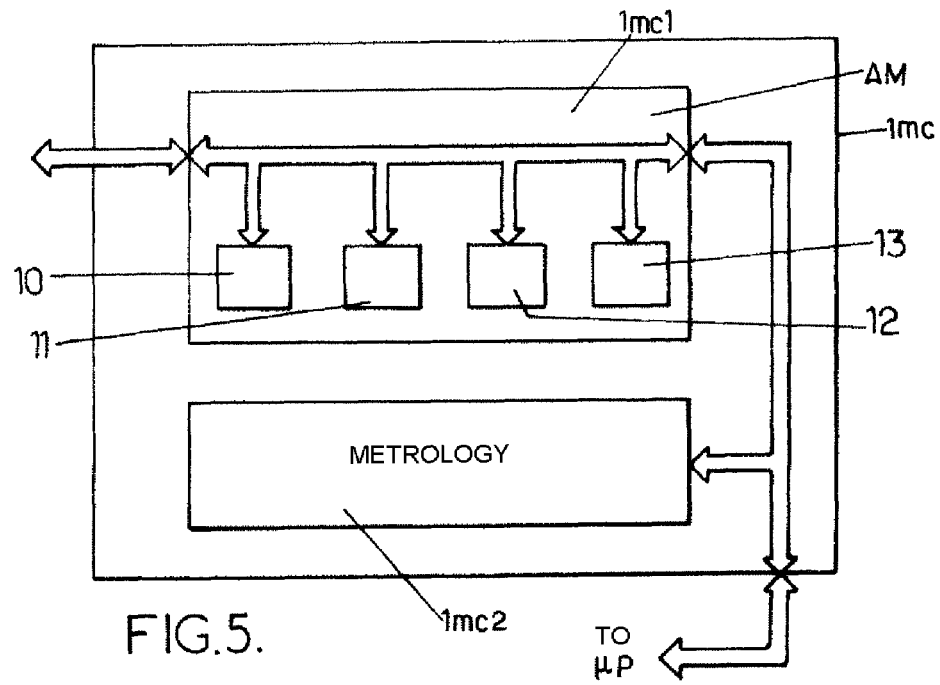
FIG. 5 shows, by way of illustration, a functional diagram in the form of a block diagram of the module for matching the functions of the base module and the metering module.

A more detailed architecture of the matching module AM will now be described with reference to FIG. 5. The aforementioned architecture is described in the preferred case where the matching module AM is installed in the metrological preprocessing module denoted 1mc in FIG. 2b.

In this case, the matching module AM is denoted 1mc1 and comprises a calibration module 10, an authentication module 11, a permanent memory, for example, of the ROM type, and a programmable memory, such as an electrically reprogrammable memory of the EEPROM type, for example.

The module 10 enables the performance of the function of calibration of the values of the current and voltage delivered by the base module via the microprocessor or microcontroller denoted 3mc in FIG. 2b.

The module 11 enables the performance of the operation of authentication of the metering module MC on the basis of authentication parameters relating to the flow distributor, the subscribing customer's installation, the validity of the operation of the installation and/or the changing or replacement of the metering module. It is understood, in particular, that the aforementioned authentication operation is performed by the microprocessor previously described. It may consist in an operation of verification of signatures integrating all of the aforementioned parameters as parameters.

In a preferred, non-limiting embodiment, it is indicated that the execution of the auto-calibration program is made conditional on a successful authentication of the metering module MC vis-à-vis the base module MS or vice versa. It is understood in particular that the notion of successful authentication of the metering module vis-à-vis the base module or vice versa of the base module vis-à-vis the metering module can be effected through comparison of parameters stored either in the non-volatile programmable memory 13 or in the permanent memory 12 of the ROM type, for example. The precise gauge of the sensors and components included in the base module MS can also be stored in the aforementioned ROM memory due to their permanent nature.

Conversely, the parameters relating to the subscribing customer's installation, the validity of the operation of the installation and/or the changing or replacement of the metering module can be stored in the non-volatile programmable memory 13 and can be updated as required by the flow distributor, said operation obviously being able to be performed remotely from an approved management center. These operations can be performed in the event of a change of subscription, for example. The updating operation can be performed thanks to the connection of each metering module and/or base module and the approved management center via a dedicated network, a PLC network, or a network supporting other physical architectures.

The flow consumption modular meter which is the subject of the invention is also equipped with an antifraud system more particularly intended for the detection of fraud.

In a general manner, the most common types of fraud involve:
the breaking of seals of the access to the screw which fixes the metering module MC;
the removal of the metering module MC in the absence of authorization or approval by the flow distributor;
the replacement of the or of a metering module MC matched to a base module with a metering module originating from a different base module, and therefore not matched.

Figure 6A:
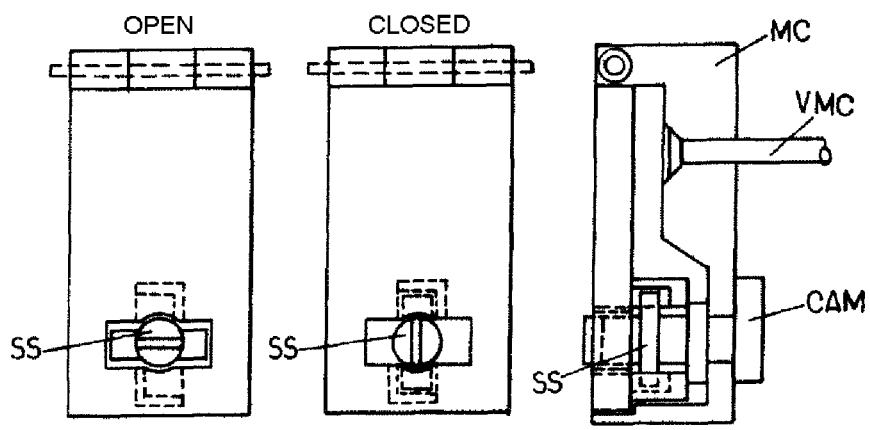
FIG. 6a shows a diagram illustrating the resources for detecting the breaking of the seals and the access to the fixing screw of the metering module.
Figure 6A:
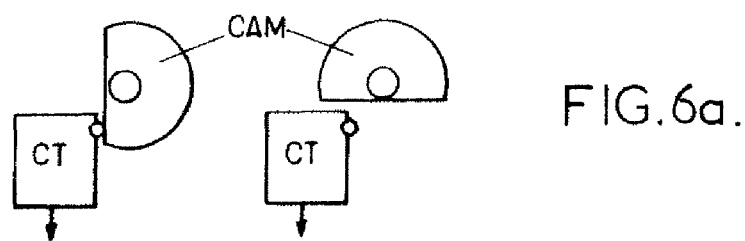

FIG. 6a shows, by way of illustration, a resource fitted to the modular meter which is the subject of the invention in order to enable detection of the breaking of the seal fitted onto the sealed screw SS and the unauthorized opening of the service flap providing access to the fixing screw VMC of the metering module MC on the base module MS.

As shown in FIG. 6a, the sealed screw denoted SS enables the locking of the opening of the service flap providing access to the fixing screw. This locking is carried out, for example, in a quarter of a turn. A cam denoted CAM is actuated directly by the aforementioned rotation-controlled screw and allows a contactor denoted CT to know the actual position of the sealed screw SS.

The change of position from closure to opening is then authorized only if the metering module MC has previously received an authorization for such an action, said authorization being transmitted either via the optical communications port OP, or via a network by the management center of the flow distributor, for example.

In particular, if, before actuating the sealed fixing screw of the service flap, the metering module MC has not received the information relating to such an action, it then proceeds with the detection of the change of position of the sealed screw SS via the cam CAM and the contactor CT and then proceeds to control the opening of the cut-off unit OC present in the base module. A message can then be displayed on the display DU "breaking of the seal—please contact your customer adviser". The electrical installation of the customer whose action is then assumed to be fraudulent is no longer supplied.

Conversely, if the metering module MC has received the instruction to access the sealed screw SS and the fixing screw of the metering module MC via the local optical communications ports or via the network, the metering module inhibits the opening of the cut-off unit in the event of the change of position of the sealed screw. This is the case during a maintenance operation on the metering module MC, for example. The metering module MC can thus be changed without suspending the supply of electricity to the customer concerned.

Moreover, if the metering module has received information authorizing a change of position of the sealed screw, it can then proceed with an authorization of this change of position during a determined period in the order of one minute, for example. Beyond such a period, any change of position automatically results in the opening of the cut-off unit OC present in the base module MS.

Figure 6B:
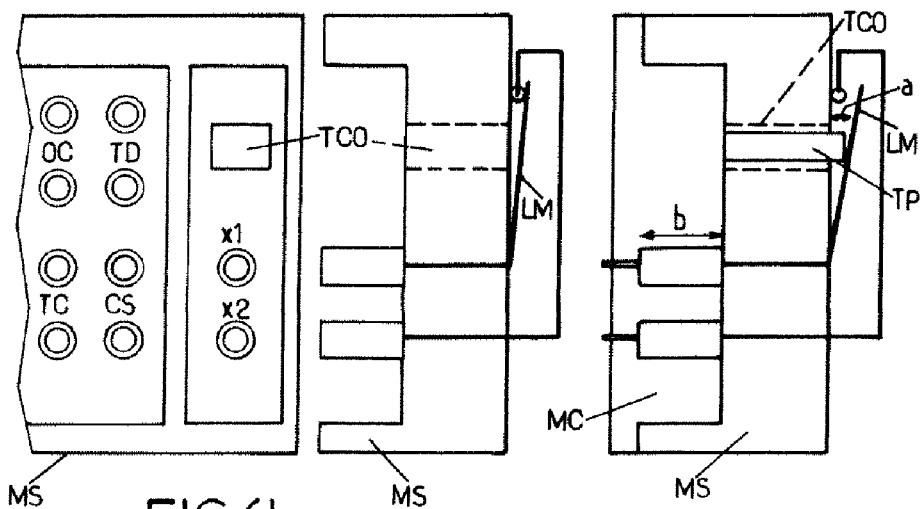
FIG. 6b shows, by way of illustration, the mode of operation of an antifraud detection module in the event of the unauthorized removal of the base module.

FIG. 6b shows the mode of operation of a device for detecting a removal of the metering module in the absence of authorization.

In a general manner, the piercing of the service flap providing access to the fixing screw without having to maneuver the sealed screw SS cannot be totally excluded. In this case, the metering module can then be disconnected and the subscribing customer's electricity supply can be maintained in a fraudulent manner.

In order to avoid this type of fraud, a corresponding fraud detection device is provided in the specific connector CSPms and is based on the same principle as that relating to the fixing screw.

As shown in FIG. 6b, the specialized connector CSPmc then comprises a male part located on the back of the metering module and a female part CSPms located on the base module MS.

FIG. 6b shows a front view of the antifraud zone of the specialized connector CSPms, comprising the service flap TCO and the connection pins or terminals x1, x2 allowing the position of an antifraud contact to be known.

FIG. 6b also comprises a sectional view of the female part of the specific connector CSPms, in the absence of the male part, and the aforementioned female part in the presence of the corresponding male part.

A device enabling detection of the start of a maneuver to remove the metering module MC is installed on the aforementioned female part shown in FIG. 6b. This device comprises a metal blade LM with a 2-position contact:
at rest, no metering module MC is connected to the base module MS as shown for the female part without a male part; in the operational or set position, a metering module MC is plugged into the base module MS.

The metering module MC is provided with a plastic pin denoted TP located on the male part of the metering module. When the metering module MC is plugged in, the plastic pin TP opens the contact of the metal plate LM to the open position, the blade position detection circuit thus being normally open. The actual position of the metal blade itself is then available to the two pins of the connector, allowing the position of the metal blade to be known and denoted x1 and x2 in FIG. 6b.

In the event of a fraudulent removal of the metering module MC, the change of state through the transition from the open state to the closed state of the contact of the metal blade LM is carried out before the complete disconnection of the pins of the specialized connector CSPmc.

The cut-off unit OC in the base module MS is then actuated if the metering module has not received an authorization either via the local communications ports OP or via the network, for example.

The metering module MC is capable of detecting a start of a maneuver to fraudulently remove said module. For this purpose, the opening distance of the metal blade LM, i.e. essentially the distance a of protrusion of the plastic pin TP beyond the service flap TCO as shown in FIG. 6b, is substantially less than the plug-in length of the contact terminals denoted b of the terminals x1 and x2, allowing the position of the metal blade LM to be recognized.

The metering module MC is then capable of controlling the opening of the cut-off unit OC before complete disconnection.

Finally, the modular meter which is the subject of the invention, in particular the antifraud resources of said meter, includes a device for detecting an unauthorized substitution of the metering module.

The aforementioned device prevents a subscribing customer or a third party from exchanging his matched metering module for a different, unmatched metering module.

In a general manner, a device of this type implements an identification of the base module MS by a metering module MC which is dedicated or approved by the flow distributor.

Moreover, and according to a noteworthy characteristic of the modular meter which is the subject of the invention, the aforementioned identification may be rendered reciprocal to jointly carry out an identification of the approved metering module MC by the base module MS. Such a process may, in particular, be carried out within the authentication process previously described in the description, notably, in a non-limiting manner, in the embodiment shown in FIG. 2b or 2c, where the authentication module AM corresponding to the module 1mc or 1mcs shown in FIG. 5 allows the aforementioned reciprocal authentication.

Figure 6C:
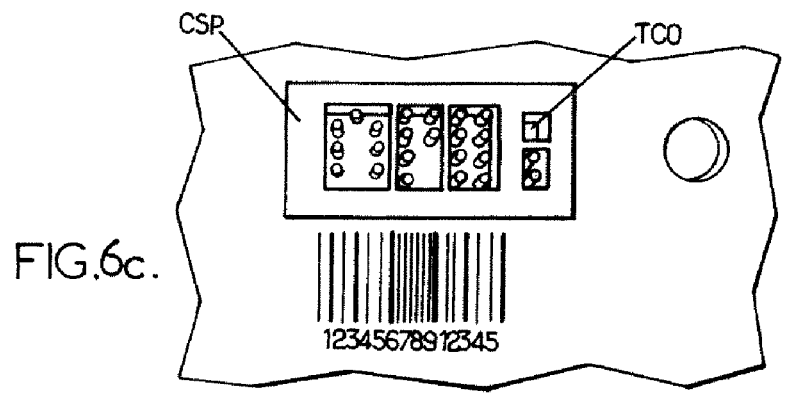
FIG. 6c and FIG. 6d show a preferred embodiment of a resource for the identification of the base module by the metering module, enabling the prevention of the fraudulent replacement of the matched metering module by a third-party metering module.
Figure 6D:
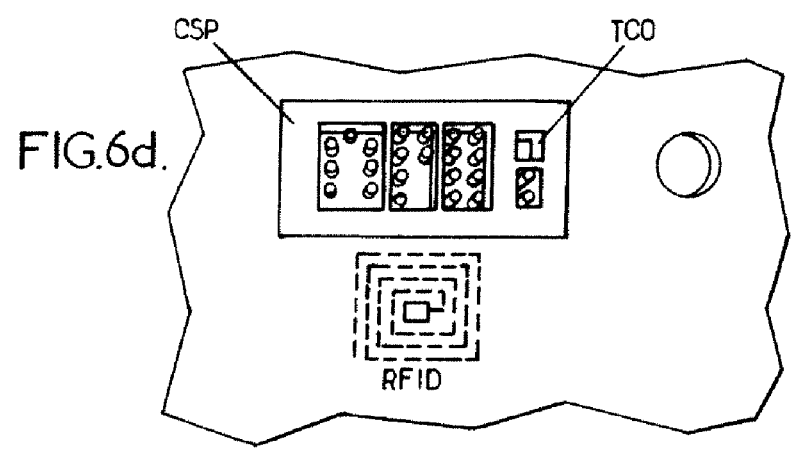

In a preferred, non-limiting, embodiment, the aforementioned identification process may be carried out on the basis of the reading of a barcode as shown in FIG. 6c or an RFID (Radio Frequency IDentification) chip as shown in FIG. 6d.

The metering module may then be programmed to continuously read either the barcode or the RFID chip, which can then be advantageously located in the vicinity of the specific connector CSPms on the terminal faceplate CB.

The aforementioned barcode may be laser-engraved into the synthetic material to encode a specific number. A marking of this type is indelible. The metering module MC is fitted with a barcode reader on the surface opposite the terminal faceplate CB and, after being plugged in, reads the aforementioned encoded number with a parameterizable frequency and on each power-up.

The same applies to the RFID chip shown in FIG. 6d, which can be integrated into the material of the terminal faceplate CB. The aforementioned chip is not visible and comprises a unique encoded number. In this solution, the barcode reader is replaced with an RFID chip reader on the surface opposite the terminal faceplate.

It is then understood that the encoded number value which is read can be compared in the metering module MC or, in particular, in the matching module AM, by means of the microprocessor, with every value stored either in the permanent memory ROM 12, or in the programmable memory 13 under the authority of the flow distributor.

The modular meter which is the subject of the invention presents an architecture of great originality, in terms of both its material structure and its functional design associated with the latter. As a result of the aforementioned architecture, the actual time of replacement of the metering module by authorized personnel can be reduced to less than five minutes instead of a duration currently in the order of 30 minutes, which, for a failure rate of 0.4% per annum for electronic meters installed in France, amounts to an annual gain in terms of maintenance manpower of between 3 and 5 million Euros.

The aforementioned architecture is moreover noteworthy in that it allows the previously described fundamental fraud attempts to be eliminated.

The aforementioned architecture is noteworthy in that it allows the meter to be changed without cutting off the installation and the electricity distribution to subscribing customers, while improving the level of security, the automatic suspension of the electricity supply if the seal of the sealed screw is removed without authorization, this authorization being programmable either locally or remotely from a server center managed by the flow distributor, the suspension of the electricity supply if the metering module is removed without authorization, the suspension of the electricity supply if the metering module is exchanged with a different, unmatched metering module without authorization.

Finally, the aforementioned architecture is also noteworthy in that it allows the deployment, operation and maintenance of the stock of meters to be improved by harmonizing all of the electrical connections or flow distribution connections on subscribing customers' premises, while guaranteeing a high level of protection and providing management of meter stocks.

The invention claimed is:

1. A modular meter for flow consumption by a subscribing customer, the modular meter comprising at least:
   a base module allowing the connection configuration of the flow delivery point to be adapted, to provide the connection of the flow distribution lines and the supply lines of the subscriber installation, said base module being equipped with a metering connection interface and comprising at least one cut-off unit;
   a metering module installed by plugging it into said base module and equipped with a connection interface for connecting to said base module via said metering connection interface, wherein said metering module further comprises antifraud resources allowing the control, in said based module, of said cut-off unit;
   wherein all the electrical components for performing non-intelligent functions of a permanent nature are installed in said base module, and all the electronic components for performing intelligent functions of a changeable nature are installed in said metering module.

2. The modular meter as claimed in claim 1, wherein, for a flow such as electrical current, said base module is adapted to provide the connection to the metering board, said metering connection interface comprising a specific electrical connector and said connection interface for connecting to said base module which is fitted to said metering module comprising a different specific electrical connector, said metering module being connected to said base module by simply plugging said different specific electrical connector into said specific electrical connector.

3. The modular meter as claimed in claim 2, wherein the components performing the functions of a changeable nature comprise at least the components of metrological preprocessing, processing by microcontroller and networked communications.

4. The modular meter as claimed in claim 1, wherein the components performing the functions of a permanent nature comprise at least: the current sensors, the voltage sensors, the cut-off units, the voltage connection circuits, the physical communications links to said subscribing customer and to the flow-distributing entity.

5. The modular meter as claimed in claim 1, wherein said modular meter further comprises a module for matching the functions of the base module and the metering module, said matching module enabling the performance, during the connection of said metering module to said base module, of at least a function of calibration of the values of the current and voltage delivered by said base module respectively subscribed, requested and measured by said metering module, according to the installation parameters of the subscribing customer.

6. The modular meter as claimed in claim 5, wherein said matching module further enables the performance of a function of authentication of said metering module on the basis of authentication parameters relating to at least one of:
the flow distributor,
the subscribing customer's installation,
the validity of the operation of the installation, and
the changing or replacement of said metering module.

7. The modular meter as claimed in claim 6, wherein said matching module comprises at least a precise gauge of the sensors and components included in said base module.

8. The modular meter as claimed in claim 6, wherein said matching module further comprises means for storing a plurality of parameters, parameters for correction of all of the components included in said base module, authentication of the subscribing customer's installation, the flow-distributing entity.

9. The modular meter as claimed in claim 6, wherein said matching module comprises a program for auto-calibration of the components of the base module, directly executable by said microcontroller.

10. The modular meter as claimed in claim 6, wherein the execution of said auto-calibration program is conditional on a successful authentication of said metering module vis-à-vis said base module or vice versa.

11. The modular meter as claimed in claim 5, wherein said matching module is installed either in the base module or in the metering module.

12. The modular meter as claimed in claim 1, wherein said antifraud resources comprising at least:
a sealed screw for accessing the fixing screw of said metering module on said base module;
means for detecting an unauthorized access to said sealed fixing screw.

13. The modular meter as claimed in claim 1, wherein said antifraud resources further comprise means for detecting an unauthorized removal of the metering module.

14. The modular meter as claimed in claim 1, wherein said antifraud resources further comprise means for detecting an unauthorized substitution of the metering module.

* * * * *